United States Patent [19]

Watanabe

[11] Patent Number: 4,811,290
[45] Date of Patent: Mar. 7, 1989

[54] SEMICONDUCTOR MEMORY DEVICE

[75] Inventor: Shigeyoshi Watanabe, Yokohama, Japan

[73] Assignee: Kabushiki Kaisha Toshiba, Kawasaki, Japan

[21] Appl. No.: 31,615

[22] Filed: Mar. 30, 1987

[30] Foreign Application Priority Data

Apr. 1, 1986 [JP] Japan .................................. 61-74979

[51] Int. Cl.$^4$ ......................... G11C 11/24; G11C 7/00
[52] U.S. Cl. .................................... 365/149; 365/194; 365/205; 365/210
[58] Field of Search ................ 365/149, 205, 210, 194

[56] References Cited

U.S. PATENT DOCUMENTS 4,421,996 12/1983 Chuang et al. ...................... 365/205

FOREIGN PATENT DOCUMENTS 2623219 4/1982 Fed. Rep. of Germany .

OTHER PUBLICATIONS

Lynch, Boll: Optimization of the Latching Pulse for Dynamic Flip-Flop Sensors, in: IEEE Journal of Solid-State Circuits, vol. SC-9, No. 2, Apr. 1974, pp. 49-54.

H. Masuda et al: "A 5V-Only 64K Dynamic RAM Based on High S/N Design", IEEE J. Solid State Circuits, SC-15, pp. 846-854 (1980).

*Primary Examiner*—James W. Moffitt
*Attorney, Agent, or Firm*—Oblon, Fisher, Spivak, McClelland & Maier

[57] ABSTRACT

A dynamic random access memory including a sense amplifier having MOSFETs, which constitute a flip-flop, and an activating MOSFET. A memory cell includes a switching MOSFET and a capacitor having a grooved structure. A dummy cell includes a switching MOSFET and capacitor having a planar structure. The activating MOSFET has its gate coupled to a gate bias generator, which comprises a reference capacitor group consisting of planar type capacitors having a nearly constant capacitance, irrespective of the influence of process parameters, and a monitoring capacitor group consisting of capacitors having the same grooved structure and the same capacitance as the memory cell capacitor. The reference capacitor group, and the monitoring capacitor group are pre-charged. When the sensing operation starts, the reference capacitor group and the monitoring capacitor group are short-circuited, so that a charge reallocation is executed between these groups. When a word line driver functions, the gate of the switching MOSFET of the memory cell is open, thus transferring data of the memory cell capacitor and dummy cell capacitor onto bit line $\overline{BL}$ and BL. The voltage of the node between the reference and monitoring capacitor groups, which are short-circuited, is applied to the gate of the activating MOSFET of the sense amplifier after a predetermined time delay.

30 Claims, 9 Drawing Sheets

SEMICONDUCTOR MEMORY DEVICE

BACKGROUND OF THE INVENTION

This invention relates to a semiconductor memory device, and, particularly, relates to a dynamic type semiconductor memory device in which memory cells, each comprising one MOS transistor and one capacitor, are integrated on a substrate, and which requires a refreshing operation.

Of the various types of semiconductor memory devices, a dynamic random access memory (DRAM), in which each memory cell comprises one MOS transistor and one capacitor, has a simpler structure and is therefore leading the others, in terms of integration. However, the higher the integration, the smaller the capacitance of the capacitor, which would make it difficult to keep improving the integration in memories of 1 Mbits, 4 Mbits, and so forth, while maintaining the necessary capacitance of the capacitor.

With this situation in mind, a grooved structure, which has grooves formed in the substrate and provides a capacitance utilizing the walls of the grooves, becomes more advantageous for the capacitor than a conventional planar structure. The grooved structure includes CCC (Corrugated Capacitor Cell) and FCC (Folded Capacitor Cell) structures. With the use of these structures, the capacitance of a cell can be increased without increasing the cell area; that is, the cell area can be reduced without reducing the cell capacitance, thus contributing to a higher integration of a semiconductor memory device.

Figure 1:
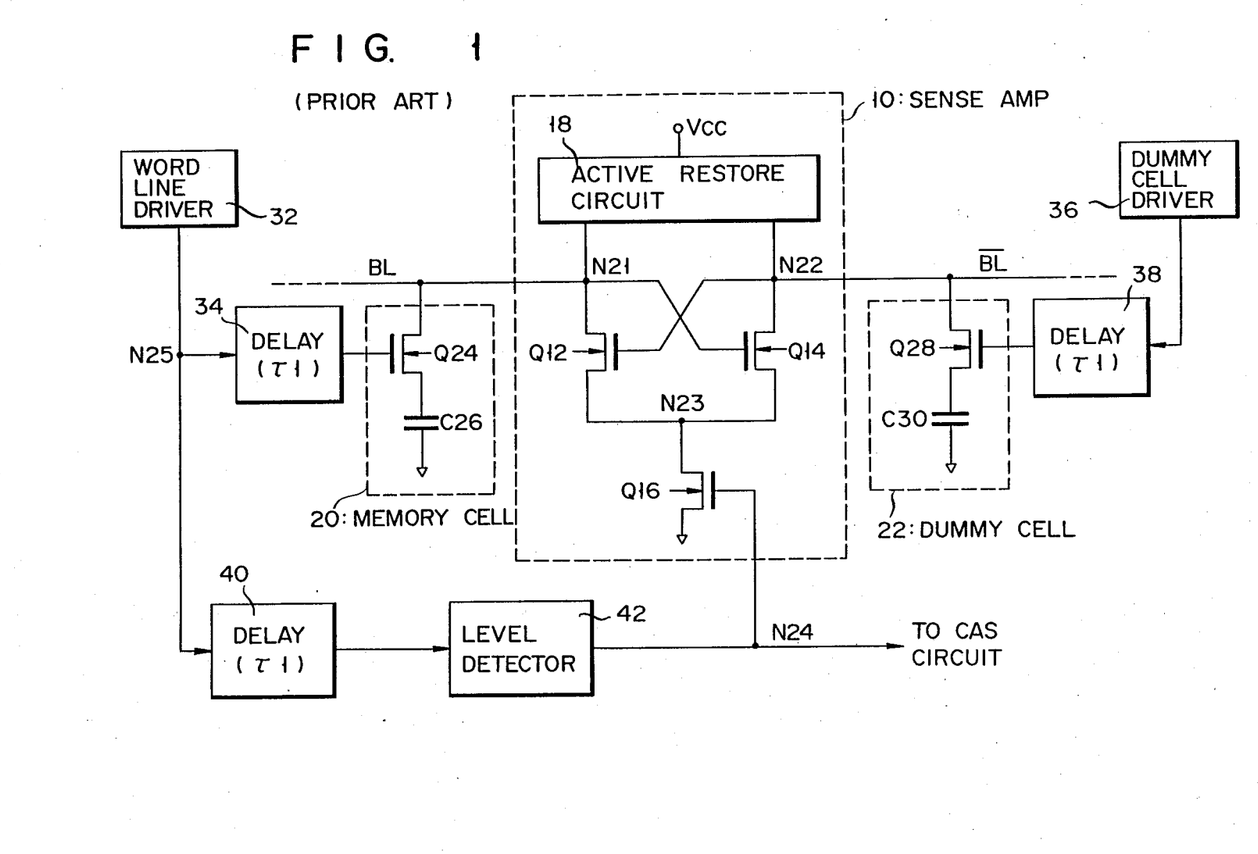
FIG. 1 is a schematic block diagram of a prior art DRAM.

FIG. 1 shows the main portion of a conventional DRAM. A sense amplifier 10 comprises MOSFETs Q12 and Q14, which constitute a flip-flop, an activating MOSFET Q16, and an active restore circuit 18. A pair of bit lines BL and $\overline{BL}$ are coupled to the respective input terminals of the flip-flop of sense amplifier 10. Each of the bit line pair BL and $\overline{BL}$ is coupled with n/2 memory cells (n: the number of memory cells in one row) and a single dummy cell. For simplicity, however, FIG. 1 shows a single memory cell 20 and a single dummy cell 22, which are coupled to each bit line.

Memory cell 20 comprises a switching MOSFET Q24 and a cell capacitor C26, while dummy cell 22 comprises a switching MOSFET Q28 and a cell capacitor C30. The memory cell capacitor C26 has the aforementioned grooved structure, and the dummy cell capacitor C30 has a planar structure.

The output of a word line driver 32 is supplied to the gate of switching MOSFET Q24 of memory cell 20 through an equivalent word line delay circuit 34 (a delay of $\tau 1$). Similarly, the output of dummy cell driver 36 is supplied to the gate of switching MOSFET Q28 of dummy cell 22 through delay circuit 38 (a delay of $\tau 1$). The output of word line driver 32 is supplied to word line level detector 42 through dummy word line delay circuit 34 (a delay of $\tau 1$). The output of level detector 42 is supplied to the gate of activating MOSFET Q16 of sense amplifier 10 as well as to a CAS circuit (not shown).

A voltage of 0 V is applied to memory cell 20 to write "0" there, and a voltage of 5 V is applied to the memory cell to write "1". When dummy cell capacitor C30 has the same capacitance as memory cell capacitor C26, a voltage of 2.5 V is applied to dummy cell 22 to write "1" there, and, when the dummy cell capacitor has a half of the capacitance of the memory cell capacitor, a voltage of 0 V is applied to the dummy cell to write "1".

Figure 2:
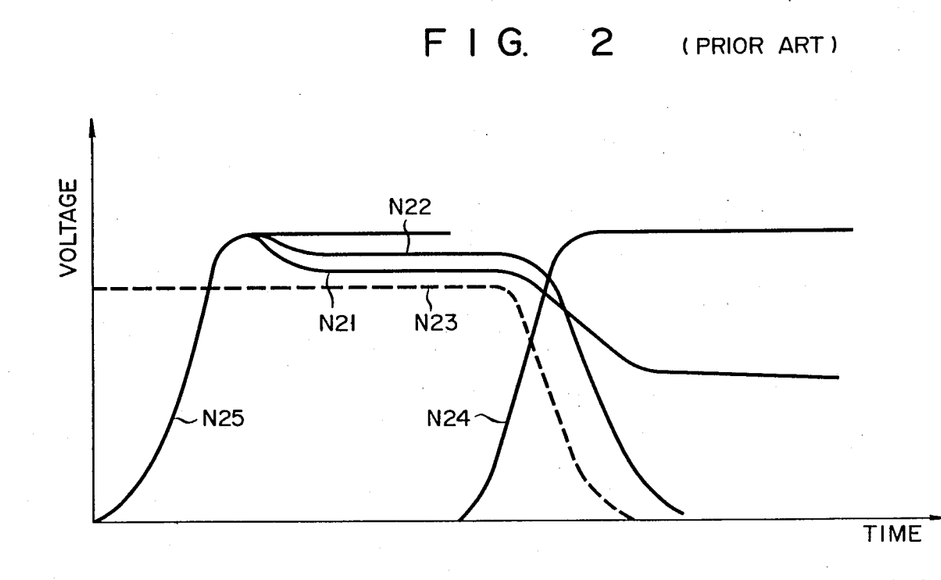
FIG. 2 is a signal waveform diagram showing the operation of the DRAM of FIG. 1.

The operation of the conventional memory device in which data "0" is stored in memory cell 20 will now be explained with reference to FIG. 2, which illustrates a voltage change at each node shown in FIG. 1.

When word line driver 32 is driven, the voltage at its output node N25 rises. With a delay of $\tau 1$ after the voltage rising, the gate of switching MOSFET Q24 of memory cell 20 is opened, transferring the data in memory cell capacitor C26 on the bit line BL (node N21). At the same time, the data in dummy cell capacitor C30 is transferred on the bit line $\overline{BL}$ (node N22). Then, dummy word line delay circuit 40 and level detector 42 are activated, thus opening the gate (node N24) of activating MOSFET Q16 of sense amplifier 10. Consequently, the voltage at node N23 of sense amplifier 10 is discharged by MOSFET Q16, which starts the sensing operation. Sense amplifier 10 can output sense data when the voltage at node N23 becomes zero. Here, it is desirable to gradually discharge the voltage at node N23 in order to prevent a malfunction of sense amplifier 10; however, if the discharging is too slow, memory access would also be slow.

The discharging speed of the voltage at node N23 has the following correlation with the accuracy of the operation of sense amplifier 10. Sense amplifier 10 amplifies the potential difference SIG ($=kC_s$) between nodes N21 and N22, where k is a constant and $C_s$ is the capacitance of memory cell capacitor C26. The sensitivity S of sense amplifier 10, which corresponds to the minimum potential difference that sense amplifier 10 can detect and amplify, is given as:

$$K\sqrt{(dv/dt)} \times (\Delta\beta/\beta + \Delta Cl/Cl) + \Delta Vt,$$

where $K\sqrt{(dv/dt)}$ is the operation speed (sensing speed) of the sense amplifier (i.e., the discharging speed of the voltage at node N23), $\Delta\beta/\beta$ is the difference in conductance between MOSFETs Q12 and Q14, $\Delta Cl/Cl$ is the difference in capacitance between bit lines BL and $\overline{BL}$, and $\Delta Vt$ is the difference in threshold values between MOSFETs Q12 and Q14. Sense amplifier 10 accurately functions when SIG > S, but malfunctions when SIG $\leq$ S.

When the capacitance of memory cell capacitor C26 is small, the potential difference SIG between nodes N21 and N22 before the sensing operation becomes significantly small. In this case, if the conductance (current driving ability) of MOSFET Q14 is larger than that of MOSFET Q12, which constitutes a flip-flop together with MOSFET Q14, then MOSFET Q14 is turned on first, and, as a consequence, the relationship between the levels of the voltages at nodes N21 and N22 is reversed, resulting in an erroneous data readout.

To prevent such an erroneous operation, the sensitivity S of the sense amplifier needs to be smaller than SIG (potential difference between nodes N21 and N22) even when the memory cell capacitor has a minimum capacitance. It is the sensing speed $K\sqrt{(dv/dt)}$ in the sensitivity S which can actually be decreased, and this sensing speed should be decreased (or slower) in order to prevent a malfunction of the sense amplifier. However, since the memory cell capacitance of a memory device produced with typical process parameters is likely to be slightly larger than the minimum value, if the sensing speed $K\sqrt{(dv/dt)}$ is fixed to the minimum according to the expected minimum value of the memory cell capacitance, the sensing speed would be unnecessarily slow.

SUMMARY OF THE INVENTION

An object of this invention is to provide a semiconductor memory device whose sense amplifier has the proper (maximum) operation speed (sensing speed) set such that the sense amplifier does not malfunction even when the conductances of a pair of transistors constituting a flip-flop included in the sense amplifier differ from each other.

It is another object of this invention to provide a semiconductor memory device whose sense amplifier can reliably read out data from a memory cell in a minimum time, even when the difference between signals read out from the memory cell and its associated dummy cell becomes small due to a reduction in the capacitance of a memory cell capacitor.

The semiconductor memory device of this invention comprises a memory cell having a capacitor and a switching element, a dummy cell also having a capacitor and a switching element, a sense amplifier for comparing data from the memory cell with data from the dummy cell, and a gate bias generator for changing the sensing speed of the sense amplifier in accordance with the capacitance of the memory cell capacitor.

DETAILED DESCRIPTION OF THE PREFERRED EMBODIMENT

An embodiment of the semiconductor memory device according to this invention will now be explained in conjunction with the accompanying drawings.

Figure 3:
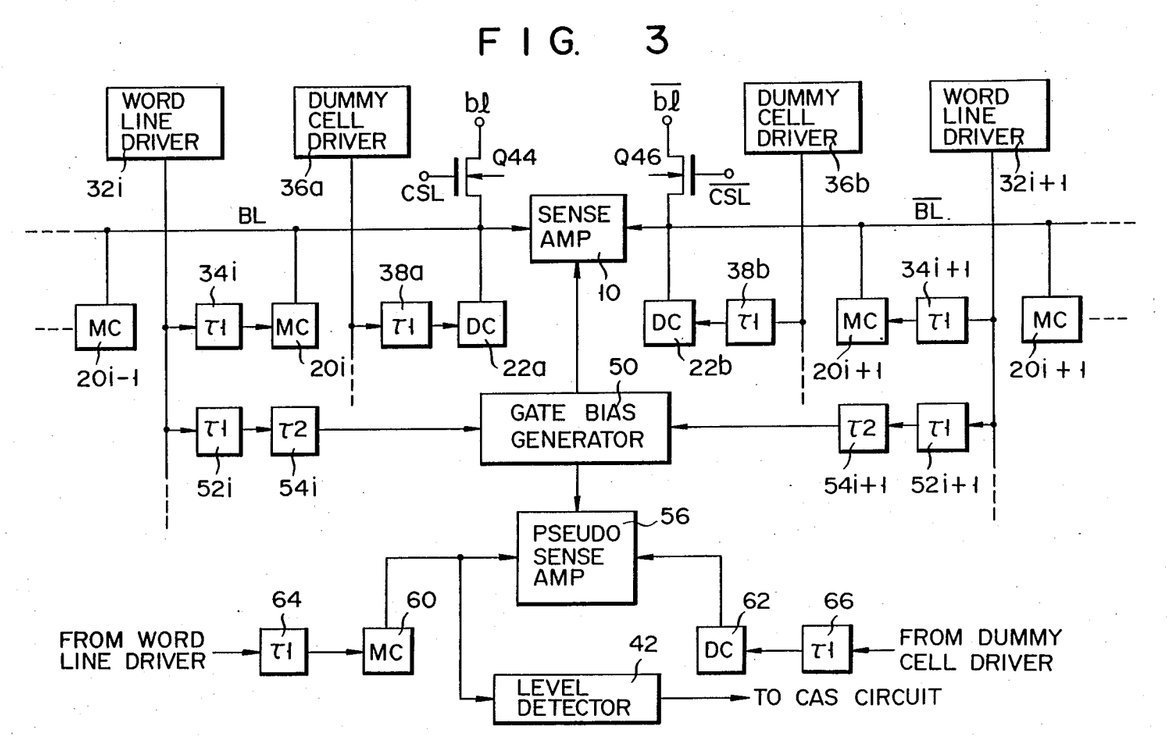
FIG. 3 is a block diagram showing part (part of a row of memory cells) of a DRAM according to the first embodiment of this invention.

FIG. 3 is a block diagram of a DRAM according to the first embodiment. Two input terminals of a sense amplifier 10 are respectively coupled with a pair of bit lines BL and $\overline{BL}$. Each bit line is coupled with i memory cells 20 (the total number of memory cells in one row being 2i) and a single dummy cell 22. Each memory cell has a capacitor with a grooved structure, while the dummy cell has a capacitor with a planar structure. Bit data bl and $\overline{bl}$ are respectively output from bit lines BL and $\overline{BL}$ via the associated MOSFETs Q44 and Q46, which are respectively controlled by column select signals CSL and $\overline{CSL}$.

The output of word line driver 32n (n=1 to 2i) is supplied via an equivalent word line delay circuit 34n (a delay of $\tau 1$) to the switching MOSFET of memory cell 20n. The outputs of dummy cell drivers 36a and 36b are respectively supplied via delay circuits 38a and 38b (a delay of $\tau 1$) to the switching MOSFETs of dummy cells 22a and 22b. The outputs of word line drivers 32n are also supplied via dummy word line delay circuits 52n (a delay of $\tau 1$) and dummy word line delay circuits 54n (a delay of $\tau 2$) to gate bias generator 50, whose output is transferred to the gate of the activating MOSFET of sense amplifier 10.

Pseudo sense amplifier 58, having the same structure as sense amplifier 10, is coupled in parallel to sense amplifier 10. Two input terminals of pseudo sense amplifier 56 are respectively coupled with memory cell 60 and dummy cell 62. The outputs of word line drivers 32n are supplied to the switching MOSFET of memory cell 60 via dummy word line delay circuit 64 (a delay of $\tau 1$), and the outputs of dummy cell drivers 36a and 36b are supplied to the switching MOSFET of dummy cell 62 via dummy word line delay circuit 66 (a delay of $\tau 1$). The voltage at the node of memory cell 60 and pseudo sense amplifier 56 is detected by level detector 42, whose output is supplied to a CAS system (not shown).

Figure 4:
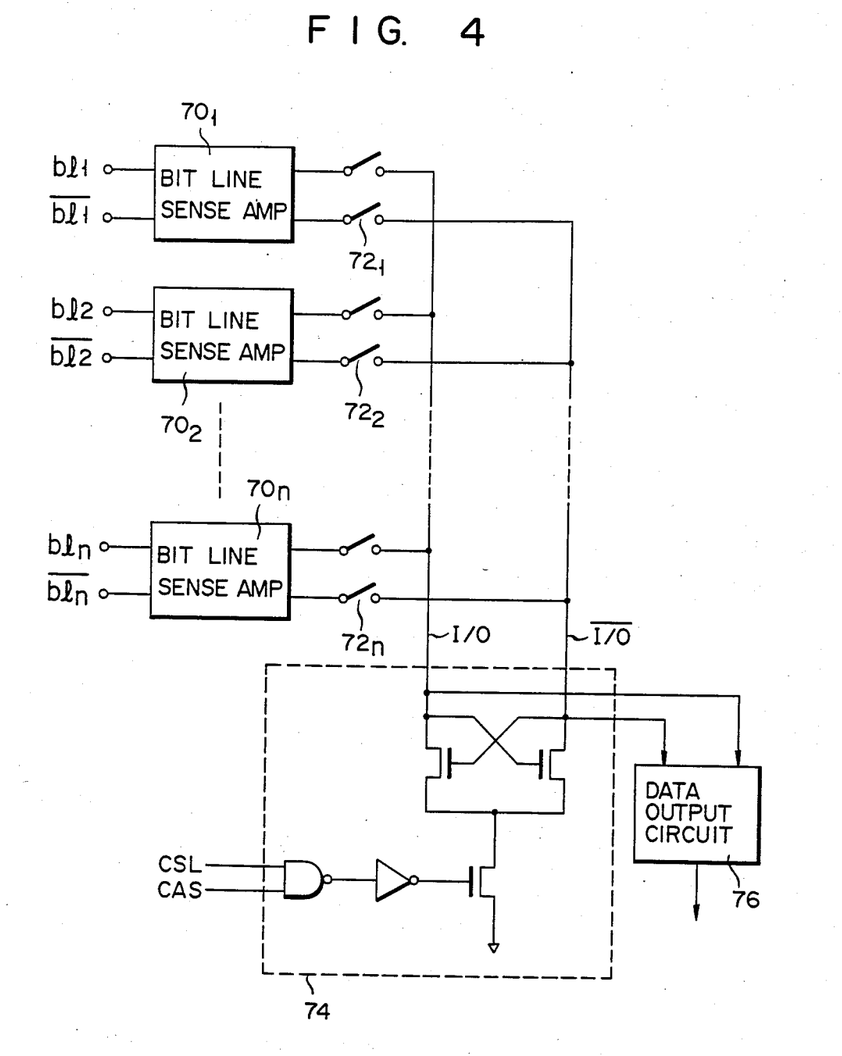
FIG. 4 is a block diagram illustrating an output section of the DRAM according to the first embodiment of this invention.

FIG. 4 shows an output circuit for bit data bl and $\overline{bl}$. Bit data pairs $bl_1$ and $\overline{bl}_2$, ..., and $bl_n$ and are respectively coupled to bit line sense amplifiers $70_1, 70_2, \ldots$, and $70_n$. The outputs of bit line sense amplifiers $70_1, 70_2, \ldots$, and $70_n$ are supplied to I/O and $\overline{I/}$ lines via the respective switches $72_1, 72_2, \ldots$, and $72_n$. The I/O and $\overline{I/}$ lines are coupled via line sense amplifier 74 to data output circuit 76 from which data from the memory cells is output.

Figure 5:
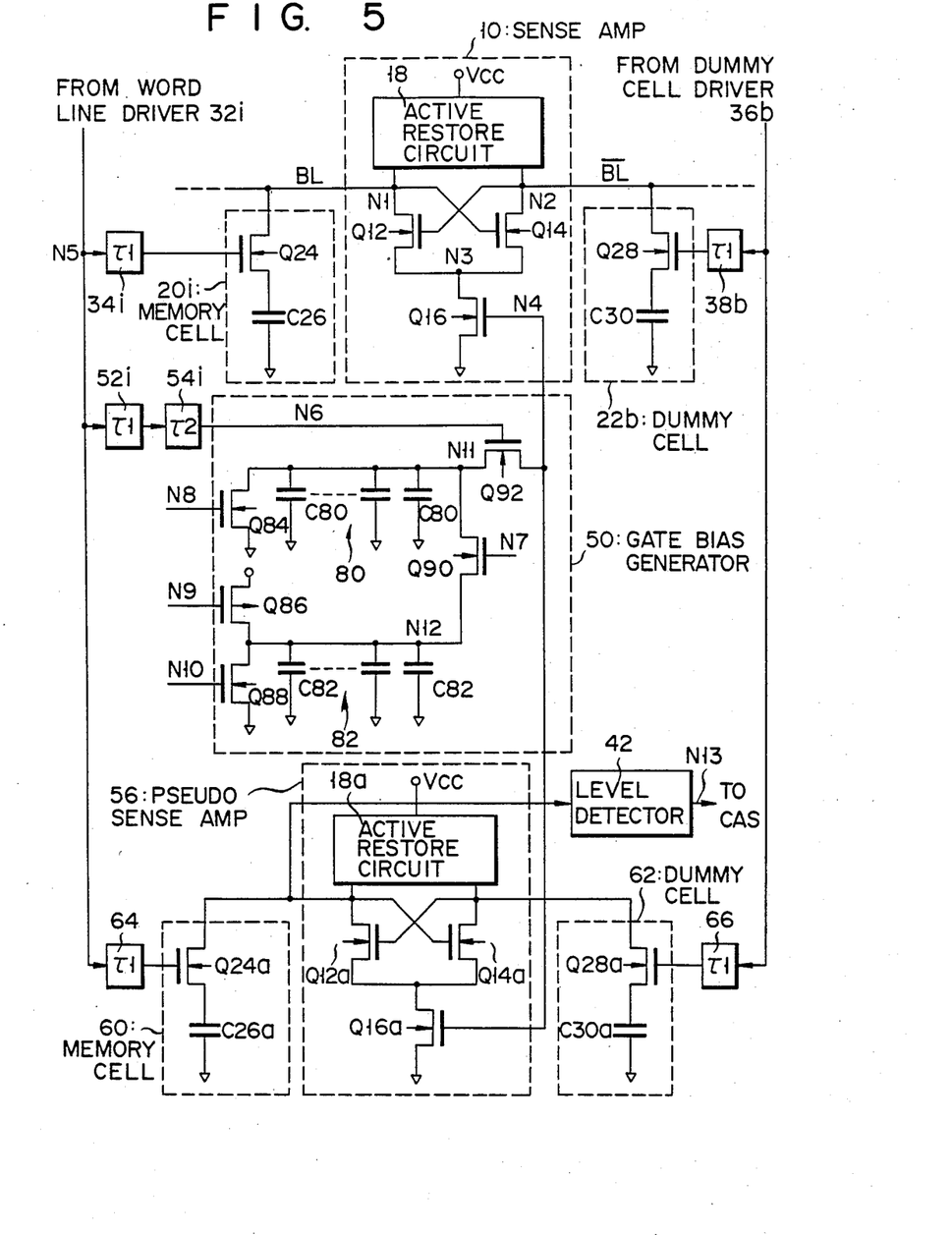
FIG. 5 is a circuit diagram showing a sense amplifier, a gate bias generator and a pseudo sense amplifier, which are shown in FIG. 3.

FIG. 5 is a detailed block diagram of sense amplifier 10, gate bias generator 50 and pseudo sense amplifier 58 shown in FIG. 3. Sense amplifier 10 comprises MOSFETs Q12 and 14, which constitute a flip-flop, activating MOSFET Q16 and active restore circuit 18. Memory cell 20i comprises switching MOSFET Q24 and cell capacitor C26, and dummy cell 22b comprises switching MOSFET Q28 and cell capacitor C30. Memory cell capacitor C26 has the aforementioned grooved structure, while dummy cell capacitor C30 has the aforementioned planar structure.

The output of word line driver 32i is supplied to the gate of switching MOSFET Q24 of memory cell 20 via word line delay circuit 34i (a delay of $\tau 1$). Similarly, the output of dummy cell driver 36b is supplied to the gate of switching MOSFET Q28 of dummy cell 22b via delay circuit 38b (a delay of $\tau 1$).

Gate bias generator 50 changes the gate bias needed to turn on activating MOSFET Q16 of sense amplifier 10, in accordance with the capacitance of the memory cell. This gate bias generator includes reference capacitor group 80, constituted by N planar type capacitors C80, which are free from the influence of process parameters and always provide a nearly constant capacitance, and monitoring capacitor group 82, constituted by N capacitors C82, which have the same structure (grooved structure) and the same size as the memory cell capacitors. Therefore, when the memory cell capacitance varies due to a variation in process parameters, the capacitance of monitoring capacitor group 82 varies accordingly.

Reference capacitor group 80 has its one terminal coupled to Vss and the other terminal coupled to node N11, and monitoring capacitor group 82 has its one terminal coupled to Vss and the other terminal coupled to node N12. The common node N11 of reference capacitor group 80 is applied with an "L" level voltage (Vss) via MOSFET Q84. The common node N12 of monitoring capacitor group 82 is applied with an "H" level voltage (Vcc) via MOSFET Q86 or with an "L" level voltage (Vss) via MOSFET Q88. Before a sensing operation is started, nodes N11 and N12 are short-circuited by MOSFET Q90, thus reallocating charges accumulated in capacitors 80 and 82. The resultant potential is transferred to the gate of activating MOSFET Q16 of sense amplifier 10 via transfer gate MOSFET Q92, which is driven by word line driver $32_i$, and the H level of the gate bias of sense amplifier 10 is controlled in accordance with the variation of the memory cell capacitance. Delay circuit $52i$, which provides the same delay as word line delay circuit $34i$ coupled to memory cell $20i$, and delay circuit $54i$ for providing a slight delay after the memory cell selection are connected between word line driver $32i$ and MOSFET Q92.

Pseudo sense amplifier 56 is provided to inform the CAS system of the end of the operation of sense amplifier 10. An "L" level voltage is always applied to capacitor C26a of memory cell 60 coupled to pseudo sense amplifier 56. This memory cell 60 is driven by word line driver $32i$ through delay circuit $64i$, which provides the same delay as word line delay circuit $34i$. The "L" level output from memory cell 60 is detected by level detector 42 and transferred to the CAS system.

Figure 6A:
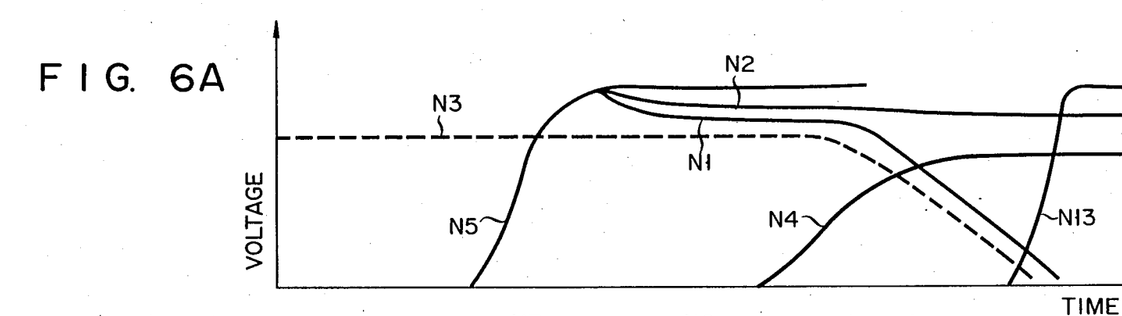
FIGS. 6A and 6B are signal waveform diagrams representing the operation of the DRAM of the first embodiment of this invention.
Figure 6B:
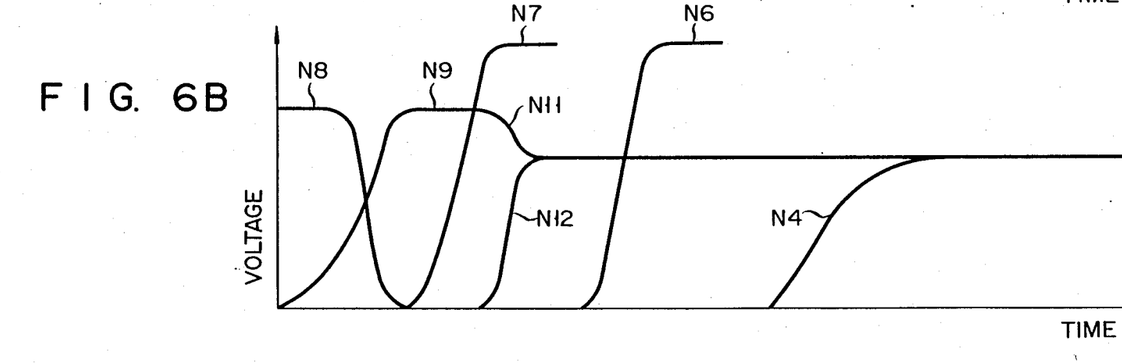

The operation of the memory device will now be explained with reference to FIGS. 6A and 6B.

Prior to execution of a sensing operation, each unit of the memory device is pre-charged. With regard to gate bias generator 50, when the potential level at node N8 is "H", n-channel MOSFET Q84 is turned on, thus pre-charging node N11 of reference capacitor group 80 to Vss. When the potential level at node N9 is "L", p-channel MOSFET Q86 is turned on and node N12 of monitoring capacitor group 82 is pre-charged to Vcc.

After MOSFETs Q84 and Q88 are turned off, the potential at node N7 becomes "H", which turns on MOSFET Q90 connected between nodes N11 and N12. As a result, nodes N11 and N12 are short-circuited, thus causing reallocation of charges between reference capacitor group 80 and monitoring capacitor group 82. With CS denoting the capacitance of reference capacitors C80 and CS' denoting the capacitance of monitoring capacitors C82, the potential at short-circuited nodes N11 and N12 can be expressed as follows:

$$Vcc \times CS'/(CS'+CS) \quad (1)$$

When word line driver $32i$ functions, the voltage at its output node N5 rises. After a delay of $\tau 1$, the gate of switching MOSFET Q24 of memory cell $20i$ is open to transfer data of cell capacitor C26 onto bit line BL (node N1). At the same time, data from dummy cell capacitor C30 is transferred onto bit line $\overline{BL}$ (node N2).

When data of memory cell $20i$ and dummy cell $22b$ are respectively transferred to nodes N1 and N2, transfer gate MOSFET Q92 is turned on after a predetermined delay caused by delay circuit $54i$. Consequently, the voltage at nodes N11 and N12 expressed by equation (1) is applied to the gate of activating MOSFET Q18 of sense amplifier 10. When the gate capacitance of activating MOSFET Q16 is sufficiently lower than that of reference capacitor group 80 and that of monitoring capacitor group 82, the voltage expressed by equation (1) is the gate voltage of MOSFET Q18. Upon receiving the gate voltage, activating MOSFET Q16 is turned on according to the gate bias, and the voltage at node N3 is discharged, thus starting the sensing operation.

In the aforementioned operation, the sensing operation of sense amplifier 10 is automatically controlled by the operation of a gate bias generator.

This control will be explained in detail below. Suppose that the memory cell capacitance CS' (the capacitances of cell capacitor C26 and monitoring capacitors C82) has a typical value and is twice as much as the capacitance CS of reference capacitors C80, which are not influenced by process parameters. Then, the bias voltage to be applied to the gate of activating MOSFET Q16 of sense amplifier 10 is $(\frac{2}{3})$Vcc. Assuming this time that memory cell capacitance CS' is small, for example, ½ of the typical value; i.e., CS' is the same as capacitance CS of reference capacitors C80, then from equation (1), the bias voltage to be applied to the gate of activating MOSFET Q16 of sense amplifier 10 is $(\frac{1}{2})$Vcc. In other words, the smaller the memory cell capacitance CS', the smaller the gate bias voltage of activating MOSFET Q16 of sense amplifier 10. When the gate bias voltage becomes smaller, the conductance of activating MOSFET Q16 also becomes smaller, reducing the discharging speed at node N3. Accordingly, the sensing speed will be reduced.

Figure 7:
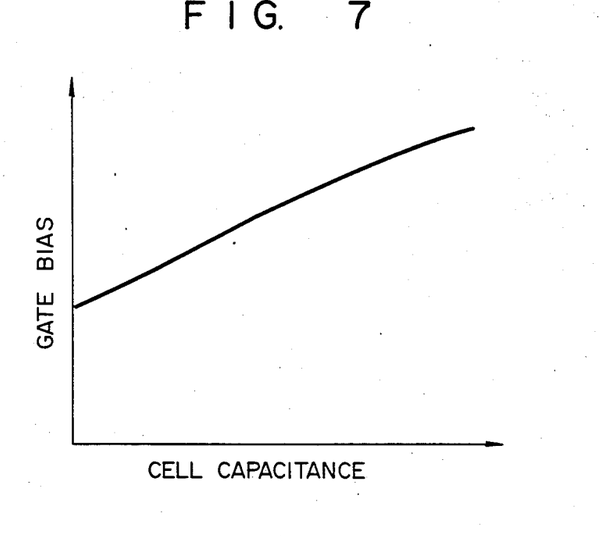
FIG. 7 is a diagram indicating the relationship between the capacitance of a memory cell and the potential level at node N4, which are shown in FIG. 5.

FIG. 7 shows the relationship between the memory cell capacitance and the "H" level voltage (gate bias) at the gate of activating MOSFET Q16, which is controlled as explained above.

According to the first embodiment, when the memory cell capacitance varies due to a variation in process parameters, the sensing speed of sense amplifier 10 is automatically controlled by gate bias generator 50. Consequently, when the memory cell capacitance is small, the sensing speed is reduced, thus preventing erroneous data readout. When the memory cell capacitance is a typical level or above, the sense amplifier has a high sensing speed, which ensures a high-speed operation of a DRAM.

The end of the sensing operation is detected by pseudo sense amplifier 56 and level detector 42 which detects the "L" level of sense amplifier 56, and is then informed to the CAS system.

Conventionally, since the sensing speed is constant, a time delay between the beginning of the sensing operation and the beginning of the function of the CAS system is realized by a relatively simple circuit, such as a clock generator. According to the first embodiment of this invention, however, since the sensing speed is assumed to vary for each production lot and therefore requires an automatic setting for each production lot, pseudo sense amplifier 56 is employed to cooperate with sense amplifier 10 in order to provide the proper delay.

Figure 8:
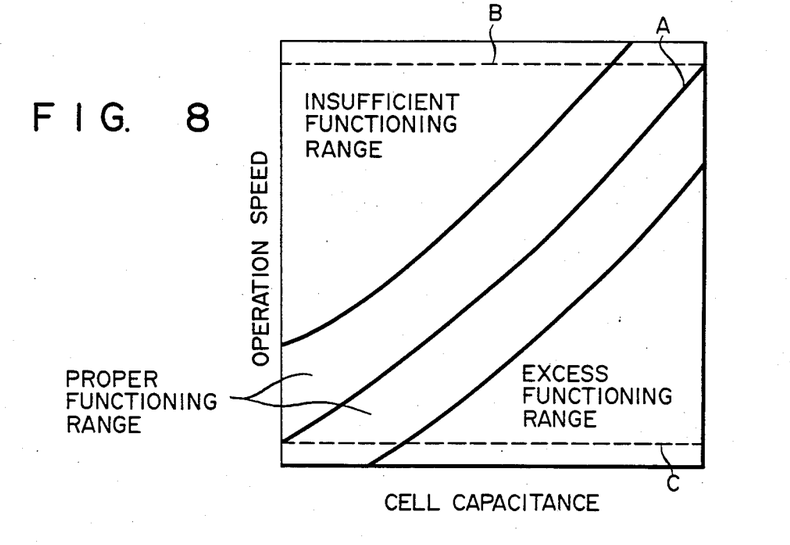
FIG. 8 is a diagram showing the relationship between the capacitance of a memory cell and the sensing speed of a sense amplifier according to the first embodiment of this invention.

FIG. 8 shows the relationship between the memory cell capacitance and the sensing speed of the sense amplifier of this embodiment. In this diagram, solid line A is the sensing speed for a conventional sense amplifier, broken line B indicates the sensing speed of a conventional sense amplifier system which is particularly designed in consideration of the operation speed of a DRAM, and broken line C indicates the sensing speed of a conventional sense amplifier which is particularly designed in consideration of the functioning margin of a DRAM. According to this embodiment, the sensing speed is automatically controlled in accordance with a variation in the memory cell capacitance, which may be caused in each production lot, thus providing the proper functioning margin for a DRAM.

Figure 9:
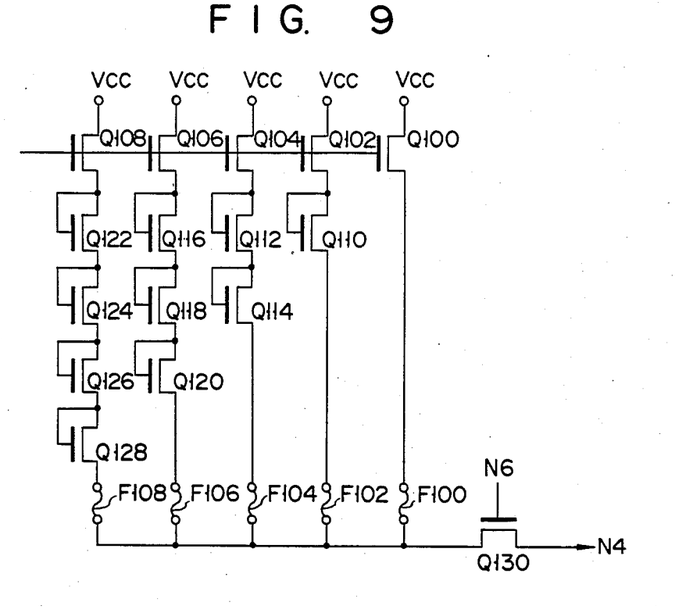
FIG. 9 is a block diagram of a gate bias generator according to the second embodiment of this invention.

The second embodiment of this invention will now be explained. FIG. 9 is a circuit diagram of gate bias generator 50 according to the second embodiment. This gate bias generator is used to permanently set the gate bias of activating MOSFET Q18 of the sense amplifier in a production lot. Gate bias generator 50 is constituted by arranging level-shifting MOSFETs Q110, Q112, Q114, Q116, Q118, Q120, Q122, Q124, Q126 and Q128 to have their drains and gates coupled to voltage source Vcc through switching MOSFETs Q100, Q102, Q104, Q106 and Q108, as shown in FIG. 9, thus providing five different parallel voltage outputs. One of the parallel voltage outputs is selected by fuses F100, F102, F104, F106, and F108, and is supplied to the gate (node N4) of activating MOSFET Q16 of sense amplifier 10 through a switching MOSFET Q130. These fuses may be selectively blown, for example, by a laser beam.

Figure 10:
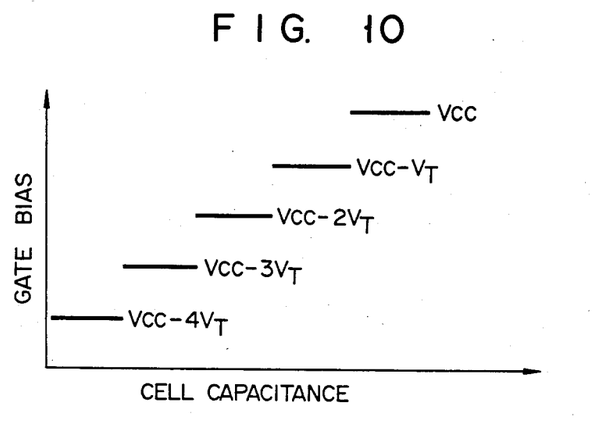
FIG. 10 is a diagram showing the relationship between the capacitance of a memory cell and the potential level at node N4 according to the second embodiment.

Assuming that the threshold value of MOSFETs Q110 to Q128 is VT and that the voltage drops of switching MOSFETs Q100 to Q108 and Q130 are negligible, then Vcc can be applied to node N4 by blowing fuses F102 to F108 and leaving only fuse F100 intact. When fuse F102 is left intact and the remaining fuses are blown, a voltage of $Vcc-V_T$ is applied to node N4. In this manner, the gate bias for activating MOSFET Q16 of sense amplifier 10 can be selected from the five voltage outputs, as shown in FIG. 10, by selectively blowing one of fuses F100 to F108. The selection of fuses to be blown is determined by measuring the memory cell capacitance of a testing element region in a chip after a wafer formation process is completed.

In the second embodiment, the "H" level of the gate bias of the activating MOSFET of the sense amplifier is permanently set in accordance with a variation in the memory cell capacitance that is caused by a variation in process parameters. Therefore, this embodiment can also set the proper sensing speed for each production lot of DRAMs.

Figure 11:
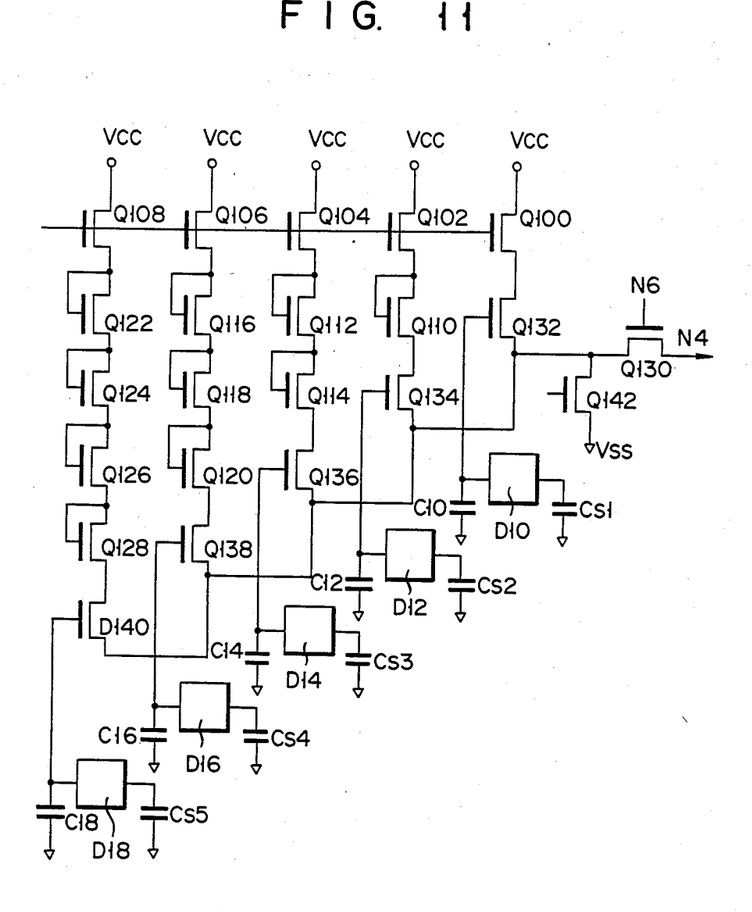
FIG. 11 is a block diagram of a gate bias generator according to the third embodiment of this invention.

FIG. 11 shows a gate bias generator 50 according to the third embodiment. This embodiment is similar to the second embodiment of FIG. 9 in that it provides five different parallel voltage outputs, but differs therefrom in that the third embodiment uses a particular circuit to automatically select one of the five outputs instead of fuses, which permanently set the gate bias. To be specific, switching MOSFETs Q132, Q134, Q136, Q138 and Q140 respectively replace fuses F100, F102, F104, F106, and F108 of FIG. 9. These MOSFETs Q132 to 140 are automatically activated or deactivated by the selection circuit, which comprises differential amplifiers D10, D12, D14, D16 and D18. Each of differential amplifiers D10 to D18 has its one input terminal coupled to its associated monitoring capacitor C10, C12, C14, C16 or C18, which has the same capacitance and the same structure as the grooved memory cell capacitor, and has its other input terminal coupled to the associated reference capacitor Cs1, Cs2, Cs3, Cs4 or Cs5 of a planar structure. Reference capacitors Cs1 to Cs5 have different capacitances from one another, which are set such that, with the typical value of the memory cell capacitor being Ct, the capacitances of capacitor Cs1 to Cs5 are respectively 8Ct, 4Ct, 2Ct, Ct, and ($\frac{1}{2}$)Ct.

Each of differential amplifiers D10 to D18 detects the difference in capacitance between its associated monitoring capacitor and reference capacitor so as to control switching MOSFETs Q132 to Q140. For example, when the capacitance of each of monitoring capacitors C10 to C18 or the memory cell capacitance CS' is between ($\frac{1}{2}$)Ct and Ct, the left terminal of only differential amplifier D18 is at an "H" level, which turns on switching MOSFET Q140 and keeps the remaining MOSFETs Q132 to 138 in an OFF state. As a result, a gate bias of $Vcc-4V_T$ is applied to gate node N4 of the activating MOSFET of the sense amplifier.

When the memory cell capacitance CS' is between Ct and 2Ct, differential amplifiers D18 and D16 are activated to set their left terminals at an "H" level. This turns on MOSFETs Q140 and Q138, so that a gate bias of $Vcc-3V_T$ is applied to gate node N4 of the activating MOSFET of the sense amplifier.

Similarly, five different gate bias voltages can automatically be generated in accordance with the memory cell capacitance, as shown in FIG. 10.

As has been explained above, according to this invention, when the cell capacitance significantly varies due to the influence of process parameters, the sensing speed of the sense amplifier can be set at the proper level without causing an erroneous data readout by the sense amplifier; when the cell capacitance becomes small, the sensing speed is reduced to reliably prevent erroneous data readout; and when the cell capacitance becomes large, the sensing speed is increased to provide a quick sensing operation. Therefore, the semiconductor memory device of this invention can always provide accurate data readout with the maximum speed.

This invention is not limited to a DRAM using a grooved type capacitor, but can effectively apply to any type whose memory cell capacitance varies due to a variation in process parameters between production lots.

What is claimed is:
1. A semiconductor memory device comprising:
   a memory cell having a capacitor and a switching element;
   a dummy cell having a capacitor and a switching element;
   a sense amplifier for comparing data from said memory cell with data from said dummy cell; and
   means for varying an operation speed of said sense amplifier in accordance with the capacitance of said capacitor of said memory cell.
2. A semiconductor memory device according to claim 1, wherein said capacitor of said memory cell has a grooved structure.
3. A semiconductor memory device according to claim 1, wherein said operation speed varying means comprises a monitoring capacitor having the same structure as said capacitor of said memory cell, a reference capacitor whose capacitance does not vary by an influence of process parameters, and means for setting the operation speed of said sense amplifier in accordance with a difference between the capacitances of said monitoring and reference capacitors.

4. A semiconductor memory device according to claim 3, wherein said monitoring capacitor has a grooved structure and said reference capacitor has a planar structure.

5. A semiconductor memory device according to claim 4, wherein said operation speed varying means comprises means for transferring an output of a word line driver to an activating element of said amplifier through a delay time in accordance with said capacitance.

6. A semiconductor memory device according to claim 1, wherein said sense amplifier comprises a flip-flop having two input terminals respectively coupled to said memory cell and said dummy cell, and means for activating said flip-flop; and said operation speed varying means varies an activating speed of said flip-flop in accordance with the capacitance of said memory cell.

7. A semiconductor memory device according to claim 6, wherein said activating means comprises a MOSFET coupled between a reference voltage terminal and said flip-flop; and said operation speed varying means comprises gate bias generating means for setting a gate bias of said MOSFET in accordance with the capacitance of said memory cell.

8. A semiconductor memory device according to claim 7, wherein said gate bias generating means comprises a monitoring capacitor having the same structure as said capacitor of said memory cell, a reference capacitor whose capacitance does not vary by an influence of process parameters, means for pre-charging said monitoring and reference capacitors, means for short-circuiting said monitoring and reference capacitors, and means for applying a voltage from a node between said monitoring and reference capacitors which are short-circuited to said MOSFET as a gate bias.

9. A semiconductor memory device according to claim 7, wherein said gate bias generating means comprises means for outputting a plurality of voltage signals of different levels in parallel, and means for selecting one of said output voltage signals.

10. A semiconductor memory device according to claim 9, wherein said selecting means comprises a fuse element.

11. A semiconductor memory device according to claim 9, wherein said selecting means comprises a monitoring capacitor having the same structure as said capacitor of said memory cell, a reference capacitor whose capacitance does not vary by an influence of process parameters, and means for selecting one of said parallel-output voltage signals in accordance with a difference between the capacitances of said monitoring and reference capacitors.

12. A semiconductor memory device comprising:
a memory cell having a capacitor and a switching element;
a dummy cell having a capacitor and a switching element;
a sense amplifier for comparing data from said memory cell with data from said dummy cell; and
means for varying an operation speed of said sense amplifier in accordance with the capacitance of said capacitor of said memory cell, said varying means comprising means for increasing said operation speed when said capacitance is greater than a predetermined value and decreasing said operation speed when said capacitance is smaller than said predetermined value.

13. A semiconductor memory device according to claim 12, wherein said capacitor of said memory cell has a grooved structure.

14. A semiconductor memory device according to claim 12, wherein said operation speed varying means comprises a monitoring capacitor having the same structure as said capacitor of said memory cell, a reference capacitor whose capacitance does not vary by an influence of process parameters, and means for setting the operation speed of said sense amplifier in accordance with a difference between the capacitances of said monitoring and reference capacitors.

15. A semiconductor memory device according to claim 14, wherein said monitoring capacitor has a grooved structure and said reference capacitor has a planar structure.

16. A semiconductor memory device according to claim 12, wherein said sense amplifier comprises a flip-flop having two input terminals respectively coupled to said memory cell and said dummy cell, and means for activating said flip-flop; and said operation speed varying means varies an activating speed of said flip-flop in accordance with the capacitance of said memory cell.

17. A semiconductor memory device according to claim 16, wherein said activating means comprises a MOSFET coupled between a reference voltage terminal and said flip-flop; and said operation speed varying means comprises gate bias generating means for setting a gate bias of said MOSFET in accordance with the capacitance of said memory cell.

18. A semiconductor memory device according to claim 17, wherein said gate bias generating means comprises a monitoring capacitor having the same structure as said capacitor of said memory cell, a reference capacitor whose capacitance does not vary by an influence of process parameters, means for pre-charging said monitoring and reference capacitors, means for short-circuiting said monitoring and reference capacitors, and means for applying a voltage from a node between said monitoring and reference capacitors which are short-circuited to said MOSFET as a gate bias.

19. A semiconductor memory device according to claim 17, wherein said gate bias generating means comprises means for outputting a plurality of voltage signals of different levels in parallel, and means for selecting one of said output voltage signals.

20. A semiconductor memory device according to claim 19, wherein said selecting means comprises a fuse element.

21. A semiconductor memory device according to claim 19, wherein said selecting means comprises a monitoring capacitor having the same structure as said capacitor of said memory cell, a reference capacitor whose capacitance does not vary by an influence of process parameters, and means for selecting one of said parallel-output voltage signals in accordance with a difference between the capacitances of said monitoring and reference capacitors.

22. A semiconductor memory device comprising:
a memory cell having a capacitor and a switching element;
a dummy cell having a capacitor and a switching element;
a sense amplifier for comparing data from said memory cell with data from said dummy cell; and
means for varying an operation speed of said sense amplifier in accordance with the capacitance of said capacitor of said memory cell;

wherein said operation speed varying means comprises a monitoring capacitor having the same structure as said capacitor of said memory cell, a reference capacitor whose capacitance does not vary by an influence of process parameters, and means for setting the operation speed of said sense amplifier in accordance with a difference between the capacitances of said monitoring and reference capacitors.

23. A semiconductor memory device according to claim 22, wherein said capacitor of said memory cell has a grooved structure.

24. A semiconductor memory device according to claim 22, wherein said monitoring capacitor has a grooved structure and said reference capacitor has a planar structure.

25. A semiconductor memory device according to claim 22, wherein said sense amplifier comprises a flip-flop having two input terminals respectively coupled to said memory cell and said dummy cell, and means for activating said flip-flop; and said operation speed varying means varies an activating speed of said flip-flop in accordance with the capacitance of said memory cell.

26. A semiconductor memory device according to claim 25, wherein said activating means comprises a MOSFET coupled between a reference voltage terminal and said flip-flop; and said operation speed varying means comprises gate bias generating means for setting a gate bias of said MOSFET in accordance with the capacitance of said memory cell.

27. A semiconductor memory device according to claim 26, wherein said gate bias generating means comprises a monitoring capacitor having the same structure as said capacitor of said memory cell, a reference capacitor whose capacitance does not vary by an influence of process parameters, means for pre-charging said monitoring and reference capacitors, means for short-circuiting said monitoring and reference capacitors, and means for applying a voltage from a node between said monitoring and reference capacitors which are short-circuited to said MOSFET as a gate bias.

28. A semiconductor memory device according to claim 26, wherein said gate bias generating means comprises means for outputting a plurality of voltage signals of different levels in parallel, and means for selecting one of said output voltage signals.

29. A semiconductor memory device according to claim 28, wherein said selecting means comprises a fuse element.

30. A semiconductor memory device according to claim 28, wherein said selecting means comprises a monitoring capacitor having the same structure as said capacitor of said memory cell, a reference capacitor whose capacitance does not vary by an influence of process parameters, and means for selecting one of said parallel-output voltage signals in accordance with a difference between the capacitances of said monitoring and reference capacitors.

* * * * *